(12) United States Patent
Rincon-Mora

(10) Patent No.: US 6,545,511 B2
(45) Date of Patent: Apr. 8, 2003

(54) ADJUSTABLE TEMPERATURE-COMPENSATED THRESHOLD CIRCUIT WITH TRIP-POINTS EXCEEDING THE GIVEN SUPPLIES

(75) Inventor: Gabriel A. Rincon-Mora, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/106,436

(22) Filed: Mar. 26, 2002

(65) Prior Publication Data

US 2002/0167349 A1 Nov. 14, 2002

Related U.S. Application Data

(60) Provisional application No. 60/281,972, filed on Apr. 6, 2001.

(51) Int. Cl.[7] .................................................. H03K 5/22
(52) U.S. Cl. ......................................... 327/83; 327/513
(58) Field of Search ............................... 327/50, 53, 58, 327/60, 62, 74, 77, 80, 81, 83, 512, 513

(56) References Cited

U.S. PATENT DOCUMENTS 5,111,071 A * 5/1992 Kwan et al. .................. 327/77

* cited by examiner

Primary Examiner—Jeffrey Zweizig
(74) Attorney, Agent, or Firm—Alan K. Stewart; W. James Brady, III; Frederick J. Telecky, Jr.

(57) ABSTRACT

The temperature compensated threshold circuit includes: a positive trip point circuit 60 for providing a positive trip point when an input voltage PSM is higher than a positive supply voltage VCC; a negative trip point circuit 62 for providing a negative trip point when the input voltage PSM is below a negative supply voltage AGND; and a bias circuit 64 for providing to the positive and negative trip point circuits 60 and 62 a first current proportional to absolute temperature and a second current proportional to a base emitter voltage.

20 Claims, 1 Drawing Sheet

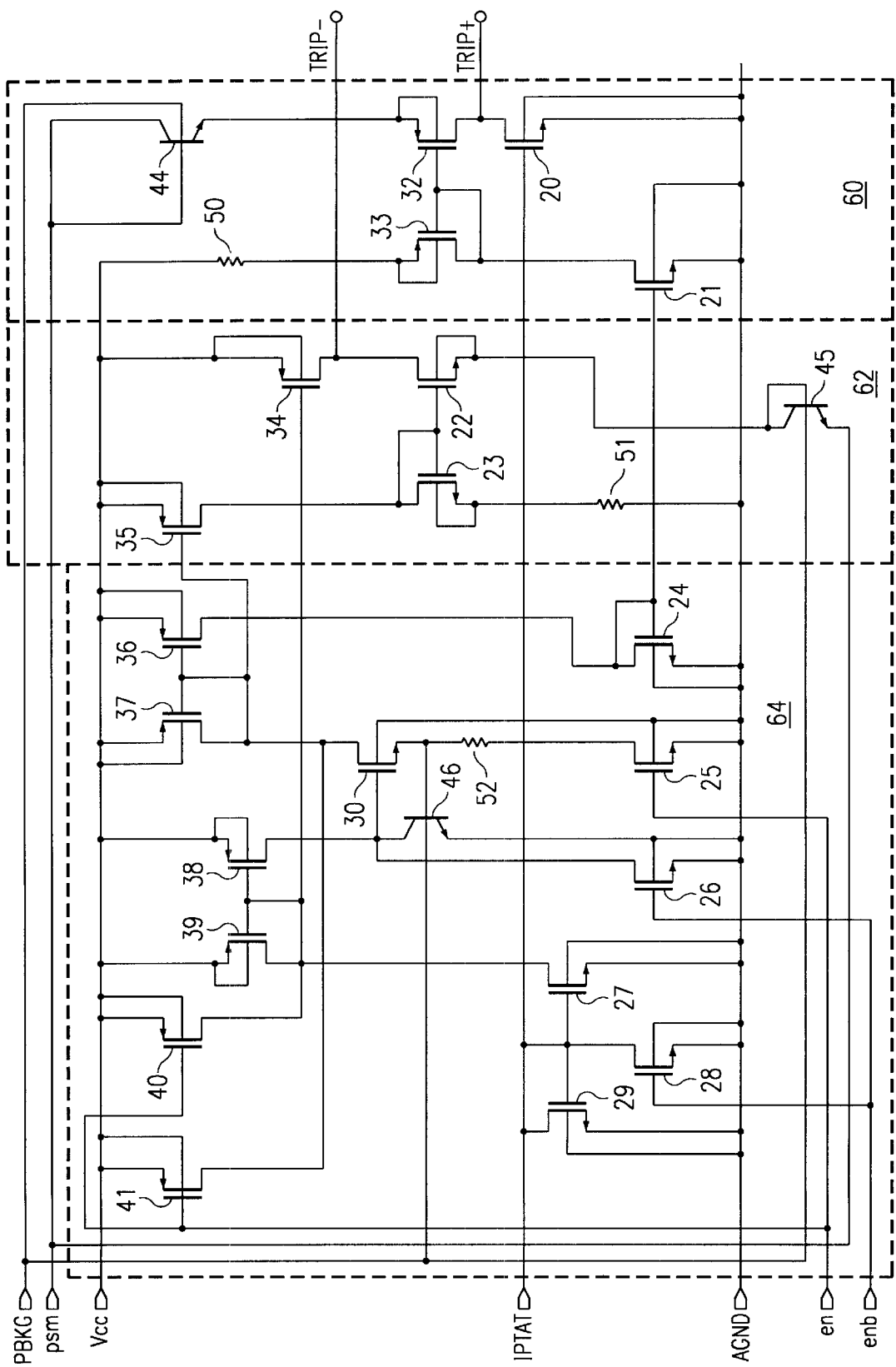

ADJUSTABLE TEMPERATURE-COMPENSATED THRESHOLD CIRCUIT WITH TRIP-POINTS EXCEEDING THE GIVEN SUPPLIES

This application claims priority under 35 USC 119 (e)(1) of provisional application number 60/281,972, filed Apr. 6, 2001.

FIELD OF THE INVENTION

This invention generally relates to electronic systems and in particular it relates to adjustable temperature-compensated threshold circuits.

BACKGROUND OF THE INVENTION

The trip-points of threshold circuits typically lie within the given supply range in order to work properly. In today's market, though, the need for multi-functional pins is becoming more necessary as the IC's become increasingly pin and pad limited. With growing system integration and increasing silicon-packing densities, the package and its given pin-count become a limiting factor. As a result, the system can easily become pin limited.

SUMMARY OF THE INVENTION

A temperature compensated threshold circuit includes: a positive trip point circuit for providing a positive trip point when an input voltage is higher than a highest positive supply voltage; a negative trip point circuit for providing a negative trip point when the input voltage is below a lowest negative supply voltage; and a bias circuit for providing to the positive and negative trip point circuits a first current proportional to absolute temperature and a second current proportional to a base emitter voltage.

BRIEF DESCRIPTION OF THE DRAWINGS

In the drawings:

FIG. 1 is a schematic circuit diagram of a preferred embodiment of the temperature compensated threshold circuit.

DETAILED DESCRIPTION OF PREFERRED EMBODIMENTS

The addition of multi-functional pins greatly alleviates the problems of pin-count. For example, as systems become more complex, testing functions must be added to the pins to test different portions of the circuit. This is one case where threshold circuits exceeding the supplies become necessary. Their thresholds need to exceed the supply so that the IC stays out of test mode during normal operation. However, when the trip-point is surpassed, the IC enters test mode. In fact, the addition of a trip-point above the positive supply and another below the negative supply, using the same pin, yields two test modes in addition to the regular operation of the pin when operated within the supplies. Because of reliability issues, accuracy is required in the trip-points. For example, the trip-points need to be far enough away from the voltage supply levels to allow a noise margin. This prevents inadvertent transients from tripping the circuit. Also, the trip-points cannot be so far away from the supply voltages that electrostatic discharge protection circuitry is triggered.

The preferred embodiment circuit shown in FIG. 1 provides an accurate temperature-compensated trip-point above its positive supply and below its negative supply. The circuit draws zero current at the input pin when unasserted (input voltage is below the positive trip-point and above the negative trip-point) and only draws a nominal amount when asserted (input voltage surpasses the trip-point). The circuit of FIG. 1 includes NMOS transistors 20–29; natural (low threshold) NMOS transistor 30; PMOS transistors 32–41; bipolar transistors 44–46; resistors 50–52; current input IPTAT; enable inputs en and enb; backgate node PBKG (which is equivalent to ground node AGND in this embodiment); supply voltage node Vcc; ground AGND; input node PSM; positive threshold output trip+; and negative threshold output trip–. Transistors 25, 26, 28, 40, and 41 serve as enable/disable switches. The portion of the circuit that does the positive threshold 60 is composed of two current sinks 20 and 21 (NMOS transistors), two P-type cascading devices 32 and 33 (PMOS transistors), sensing diode 44 (bipolar transistor), and resistor 50.

The current flowing through transistor 21 is a $V_{BE}$-dependent current while the current flowing through transistor 20 is PTAT (proportional to absolute temperature). As a result, the voltage across resistor 50 is proportional to the base-emitter voltage on transistor 46, $V_{r50}=r50*V_{BE}/r52$, where $V_{R50}$ is the voltage across resistor 50, r50 is the resistance of resistor 50, $V_{BE}$ is the base-to-emitter voltage of transistor 46, and r52 is the resistance of resistor 52. When the voltage on input node PSM is not sufficiently high, transistor 44 is off and node TRIP+ is consequently pulled down to ground by transistor 20. The node TRIP+ goes high when the current flowing through diode 44 is equal to the current transistor 20 would sink given a large enough drain-source voltage.

This condition occurs when transistor 32 conducts the full PTAT current sunk by transistor 20: $V_{PSM}=V_{th}=V_{BE}+V_{SG32}-V_{SG33}-r50*V_{BE}/r52+V_{CC}=V_{BE}(1-r50/r52)+(V_{SG32}-V_{SG33})+V_{CC}=V_{BE}(1-r50/r52)+$ $$\left( \sqrt{\frac{2I_{PTAT}}{\beta}} - \sqrt{\frac{2I_{VBE}}{\beta}} \right) + VCC,$$

where VPSM is the voltage at node PSM; Vth is the threshold voltage of the circuit; VBE is the base-to-emitter voltage of transistor 44 (also, approximately equal to the base-to-emitter voltage of transistor 46); VSG32 is the source-to-gate voltage of transistor 32; and VSG33 is the source-to-gate voltage of transistor 33. The term with the square roots has a positive Temperature Coefficient (TC), [+TC]–[–TC]=[+TC]. This positive TC is used to offset the $V_{BE}$'s negative TC, first-order temperature compensation. As a result, the trip-point is flexible enough to yield virtually any value and capable of being temperature compensated to yield minimum temperature variations. Essentially, the absolute value of the trip-point is virtually set by resistor 50 (a factor of the base-emitter voltage) and temperature-compensated by the PTAT current sink 20 and the aspect ratios of transistors 32 and 33.

The negative threshold circuit 62, below ground in the circuit of FIG. 1, is achieved by a complementary version of the circuit 60 described above. The bias section 64, of course, generates the base-emitter voltage dependent current and the necessary PTAT currents. Actually, the block assumes that some other circuit generates a PTAT current and the bias section only mirrors it where necessary.

The preferred embodiment circuit of FIG. 1 provides accurate, flexible, temperature-compensated trip-points above and below the power supplies. This circuit is simple, accurate, has low quiescent current, low input current, low voltage, and is easily realizable in CMOS, bipolar, and BiCMOS process technologies.

While this invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is therefore intended that the appended claims encompass any such modifications or embodiments.

What is claimed is:

1. A threshold circuit comprising:

a first current device for providing a current proportional to absolute temperature;

a second current device for providing a current proportional to a base-emitter voltage;

a first cascading device coupled in series with the first current device;

a second cascading device coupled in series with the second current device and coupled to the first cascading device;

a diode coupled between the first cascading device and an input node; and a resistor coupled between the second cascading device and a supply node.

2. The circuit of claim 1 wherein the first and second current devices are transistors.

3. The circuit of claim 1 wherein the first and second current devices are NMOS transistors.

4. The circuit of claim 1 wherein the first and second current devices are PMOS transistors.

5. The circuit of claim 1 wherein the first cascoding device is a first transistor and the second cascoding device is a second transistor having a control node coupled to a control node of the first transistor.

6. The circuit of claim 5 wherein the first and second transistors are PMOS transistors.

7. The circuit of claim 5 wherein the first and second transistors are NMOS transistors.

8. The circuit of claim 1 wherein the diode is a bipolar transistor.

9. The circuit of claim 1 further comprising:

a bipolar transistor;

a resistor coupled between a base and emitter of the bipolar transistor; and a current mirror coupled to the resistor and to a control node of the second current device.

10. A temperature compensated threshold circuit comprising:

a positive trip point circuit for providing a positive trip point when an input voltage is higher than a positive supply voltage;

a negative trip point circuit for providing a negative trip point when the input voltage is below a negative supply voltage; and a bias circuit for providing to the positive and negative trip point circuits a first current proportional to absolute temperature and a second current proportional to a base emitter voltage.

11. The circuit of claim 10 wherein the positive trip point circuit comprises:

a first current sink for providing the current proportional to absolute temperature;

a second current sink for providing the current proportional to a base-emitter voltage;

a first cascading device coupled in series with the first current sink;

a second cascading device coupled in series with the second current sink and coupled to the first cascoding device;

a diode coupled between the first cascading device and an input node; and a resistor coupled between the second cascading device and a positive supply node.

12. The circuit of claim 10 wherein the negative trip point circuit comprises:

a first current source for providing the current proportional to absolute temperature;

a second current source for providing the current proportional to a base-emitter voltage;

a first cascading device coupled in series with the first current source;

a second cascading device coupled in series with the second current source and coupled to the first cascoding device;

a diode coupled between the first cascading device and an input node; and a resistor coupled between the second cascading device and a negative supply node.

13. The circuit of claim 11 further comprising:

a bipolar transistor;

a resistor coupled between a base and emitter of the bipolar transistor; and a current mirror coupled to the resistor and to a control node of the second current sink.

14. The circuit of claim 12 further comprising:

a bipolar transistor;

a resistor coupled between a base and emitter of the bipolar transistor; and a current mirror coupled to the resistor and to a control node of the second current source.

15. The circuit of claim 11 wherein the first and second current sinks are NMOS transistors, and the first and second cascading devices are PMOS transistors.

16. The circuit of claim 12 wherein the first and second current sources are PMOS transistors, and the first and second cascading devices are NMOS transistors.

17. The circuit of claim 11 wherein a control node of the second cascading device is coupled to the second current sink and to a control node of the first cascading device.

18. The circuit of claim 12 wherein a control node of the second cascading device is coupled to the second current source and to a control node of the first cascading device.

19. The circuit of claim 10 wherein the positive power supply is a highest positive power supply of the threshold circuit.

20. The circuit of claim 10 wherein the negative power supply is a lowest negative power supply of the threshold circuit.

* * * * *